(12) United States Patent
Cheng

(10) Patent No.: US 8,454,005 B2
(45) Date of Patent: Jun. 4, 2013

(54) CLAMPING APPARATUS

(75) Inventor: Chien-Pang Cheng, Tayuan (TW)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 190 days.

(21) Appl. No.: 13/094,808

(22) Filed: Apr. 26, 2011

(65) Prior Publication Data

US 2012/0146277 A1 Jun. 14, 2012

(30) Foreign Application Priority Data

Dec. 14, 2010 (CN) .......................... 2010 1 0587421

(51) Int. Cl.
B25B 1/24 (2006.01)

(52) U.S. Cl.
USPC ......... 269/287; 269/309; 269/900; 414/749.6

(58) Field of Classification Search
USPC ................ 108/137, 143; 198/345.2; 206/706, 206/707; 211/41.17; 29/257, 276, 281.4; 361/726, 727, 752, 759, 801, 802, 807, 809, 361/820; 414/749.6, 751.1, 937, 940, 941; 720/604, 610; 269/143, 249, 254 CS, 257, 269/287, 289 R, 302.1, 309, 329, 50, 56, 269/57, 77, 900, 902, 903
See application file for complete search history.

(56) References Cited

U.S. PATENT DOCUMENTS

| | | | | |
|---|---|---|---|---|
| 2,951,185 A * | 8/1960 | Buck | ............................. | 361/784 |
| 3,593,064 A * | 7/1971 | Wagner et al. | ................. | 361/707 |
| 3,603,845 A * | 9/1971 | Beers | ........................... | 361/796 |
| 3,853,379 A * | 12/1974 | Goodman et al. | ............ | 439/261 |
| 4,075,683 A * | 2/1978 | Johansson et al. | ............ | 361/802 |
| 4,478,331 A * | 10/1984 | Ruin | ............................. | 206/707 |
| 4,710,910 A * | 12/1987 | Ejiri | ............................. | 720/610 |
| 4,824,088 A * | 4/1989 | Siegel | .......................... | 269/309 |
| 4,896,777 A * | 1/1990 | Lewis | ........................ | 211/41.17 |
| 4,901,011 A * | 2/1990 | Koike et al. | .............. | 324/756.02 |
| 4,914,552 A * | 4/1990 | Kecmer | ........................ | 361/801 |
| 4,994,937 A * | 2/1991 | Morrison | ...................... | 361/715 |
| 5,216,578 A * | 6/1993 | Zenitani et al. | ............... | 361/690 |
| 5,382,127 A * | 1/1995 | Garric et al. | ............... | 414/217.1 |
| 5,650,917 A * | 7/1997 | Hsu | ................................ | 361/759 |
| 5,793,729 A * | 8/1998 | Soga et al. | ..................... | 720/603 |
| 5,967,740 A * | 10/1999 | Pflueger et al. | ............. | 414/749.6 |
| 6,285,556 B1 * | 9/2001 | Guth et al. | ..................... | 361/752 |
| 6,299,267 B1 * | 10/2001 | Butters | ......................... | 312/246 |
| 6,597,582 B2 * | 7/2003 | Baba | ............................. | 361/760 |
| 8,210,509 B2 * | 7/2012 | Saitta | ............................. | 269/164 |
| 2003/0161114 A1 * | 8/2003 | Berry et al. | ................... | 361/727 |
| 2008/0084675 A1 * | 4/2008 | Amirali et al. | ................ | 361/752 |

* cited by examiner

*Primary Examiner* — Lee D Wilson
*Assistant Examiner* — Tyrone V Hall, Jr.
(74) *Attorney, Agent, or Firm* — Altis Law Group, Inc.

(57) ABSTRACT

A clamping apparatus includes a receiving frame, a guide plate, two drive assemblies, and two clamping assemblies. The receiving frame includes two parallel securing arms and a connection arm. The securing arms and the connection arm define a first receiving space. Each of the securing arms defines a slot. The guide plate is configured for mounting of a workpiece thereon. The drive assemblies are configured for cooperatively moving the guide plate between a first position and a second position. When the guide plate is located at the first position, the workpiece is loaded on the guide plate and distant from the connection arm. When the guide plate is located at the second position, the workpiece is adjacent to the connection arm and entirely received in the first receiving space and the slots. The clamping assemblies are configured for cooperatively clamping the workpiece.

12 Claims, 5 Drawing Sheets

CLAMPING APPARATUS

BACKGROUND

1. Technical Field

The disclosure relates to apparatuses for clamping a workpiece, for example, such as a flexible printed circuit board.

2. Description of Related Art

Flexible printed circuit boards are light and flexible, and thus are widely used in mobile phones, such as flip phones and slider phones to electrically connect electronic components equipped in such mobile phones.

In manufacturing the flexible printed circuit boards, it is common to transport the flexible printed circuit boards between different processing stations. However, the flexible printed circuit boards are fragile and, thus easy to break or damage during transportation, resulting in inferior quality products.

Therefore, what is needed is an apparatus for clamping a flexible printed circuit board, which can overcome the limitations described.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Embodiment of the disclosure will now be described in detail below with reference to drawings.

Figure 1:
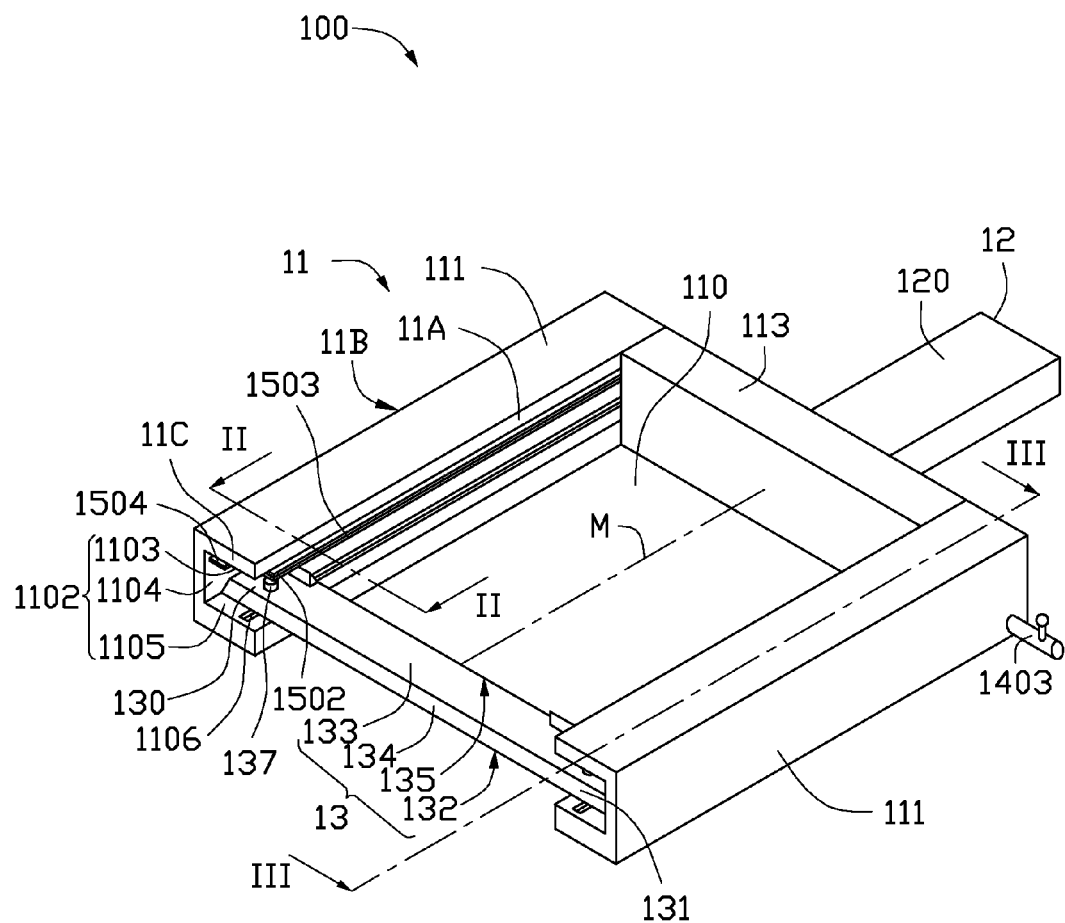
FIG. 1 is a sectional view of a clamping apparatus according to one embodiment.
Figure 2:
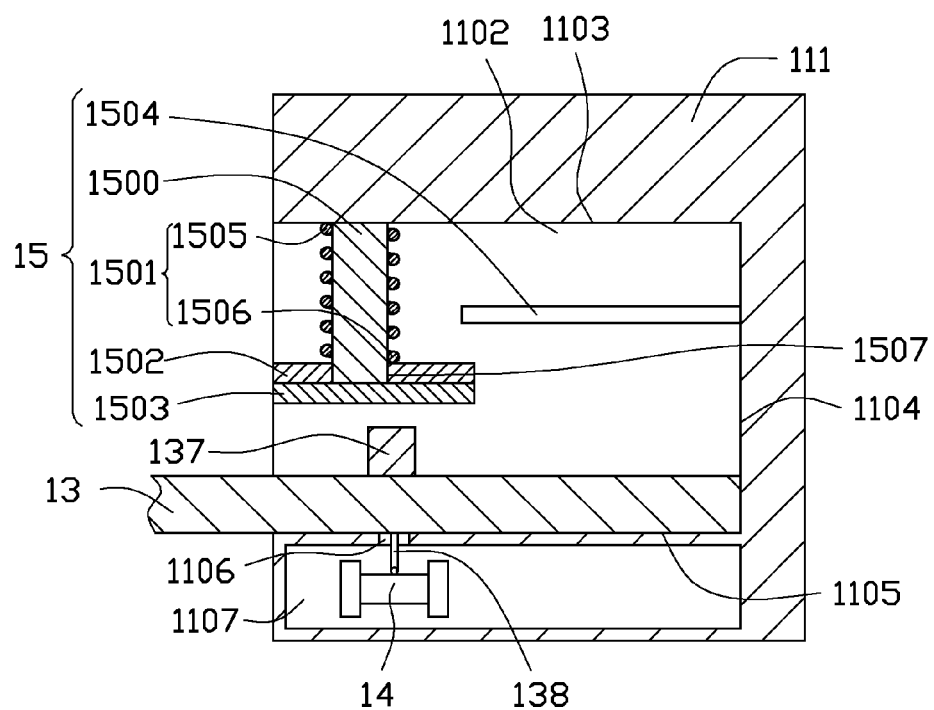
FIG. 2 is a sectional view of the clamping apparatus of FIG. 1, taken along line II-II.

Referring to FIG. 1 to FIG. 2, a clamping apparatus 100 according to one embodiment is shown. The clamping apparatus 100 includes a receiving frame 11, an operating bar 12, a guide plate 13 (see FIG. 1), two drive assemblies 14, and two clamping assemblies 15 (see FIG. 2).

The receiving frame 11 is substantially a U-shaped configuration. In this embodiment, the receiving frame 11 includes two securing arms 111 and a connection arm 113. The two securing arms 111 are substantially parallel to each other, and extend from opposite ends of the connection arm 113 in a direction away from the connection arm 113.

Each of the securing arms 111 and the connection arm 113 has a rectangular transverse section. In this embodiment, the securing arms 111 and the connection arm 113 cooperatively define a first receiving space 110.

As shown in FIG. 1, each of the securing arms 111 includes an inner lateral surface 11A, an outer lateral surface 11B, and an end surface 11C. The inner lateral surface 11A is exposed in the first receiving space 110. The outer lateral surface 11B is exposed at an exterior of the first receiving space 110. The end surface 11C is distant from the connection arm 113, and is located between and adjoins the inner lateral surface 11A and the outer lateral surface 11B. In this embodiment, the inner lateral surface 11A and the outer lateral surface 11B are substantially parallel to each other. In addition, the securing arm 111 has a slot 1102 defined in the inner lateral surface 11A. The slot 1102 extends along a lengthwise direction of the securing arm 111, and extends all the way through the end surface 11C.

The securing arm 111 includes an upper surface 1103, a side surface 1104, and a lower surface 1105 in the slot 1102. The lower surface 1105 is oriented toward the upper surface 1103. The side surface 1104 is located between and adjoins the upper surface 1103 and the lower surface 1105. In this embodiment, the side surface 1104 is substantially parallel to the inner lateral surface 11A. In addition, each of the upper surface 1103 and the lower surface 1105 are substantially perpendicular to the inner lateral surface 11A.

As shown in FIG. 2, the securing arm 111 defines a groove 1106 and a second receiving space 1107. The second receiving space 1107 is defined inside the securing arm 111. The groove 1106 is defined in the lower surface 1105, and communicates with the second receiving space 1107. In this embodiment, each of the groove 1106 and the second receiving space 1107 extends along the lengthwise direction of the securing arm 111. The second receiving space 1107 is wider than the groove 1106 in a direction substantially parallel to a lengthwise direction of the connection arm 113.

In this embodiment, the receiving frame 11 has a centerline M. The two securing arms 111 are symmetrical relative to each other across the centerline M. Similarly, the two drive assemblies 14 are symmetrical relative to each other across the centerline M. The two clamping assemblies 15 are symmetrical relative to each other across the centerline M.

The operating bar 12 protrudes from the connection arm 113 and faces away from the securing arms 111. In this embodiment, the operating bar 12 extends along the centerline M, and the operating bar 12 is substantially cuboid-shaped. In alternative embodiments, the operating bar 12 may be substantially cylindrical. In other alternative embodiments, a rubber friction pad may be provided and attached, or can be assembled to an outer surface 120 of the operating bar 12. Thus, a user is able to easily grasp the operating bar 12 to transport the clamping apparatus 100.

The guide plate 13 in this embodiment is substantially cuboid-shaped, and includes a first end 130 and an opposite second end 131 to the first end 130. The first end 130 and the second end 131 are arranged on the respective securing arms 111. In this embodiment, the first end 130 and the second end 131 are secured in the respective slots 1102.

The guide plate 13 includes a first surface 132, a second surface 133, a third surface 134 and a fourth surface 135. The first surface 132 and the second surface 133 are located at opposite sides of the guide plate 13, and are substantially parallel to each other. Each of the third surface 134 and the fourth surface 135 is located between and adjoins the first and the second surface 132 and 133. The fourth surface 135 is adjacent to the connection arm 113. The third surface 134 is distant from the connection arm 113. In this embodiment, the third surface 134 is angled with respect to the first surface 132 or the second surfaces 133. An angle between the third surface 134 and the first surface 132, for example is preferably less than 60 degrees. The fourth surface 135 is generally perpendicular to the first or the second surfaces 132 and 133.

The clamping apparatus 100 further includes two blocks 136, two protrusions 137, and two connecting pins 138. The blocks 136 and the protrusions 137 protrude from the second surface 133. In this embodiment, the two blocks 136 protrude from the respective first and second ends 130 and 131. The two protrusions 137 also protrude from the respective first and second ends 130 and 131. In addition, the two blocks 136 are adjacent to the connection arm 113, and the two protrusions 137 are distant from the connection arm 113. Furthermore, a height of each block 136 relative to the second surface 133 is greater than that of each protrusion 137. In this embodiment, the height of each block 136 is 3 mm. The height of each protrusion 136 is in a range from 1 mm to 2 mm.

Figure 3:
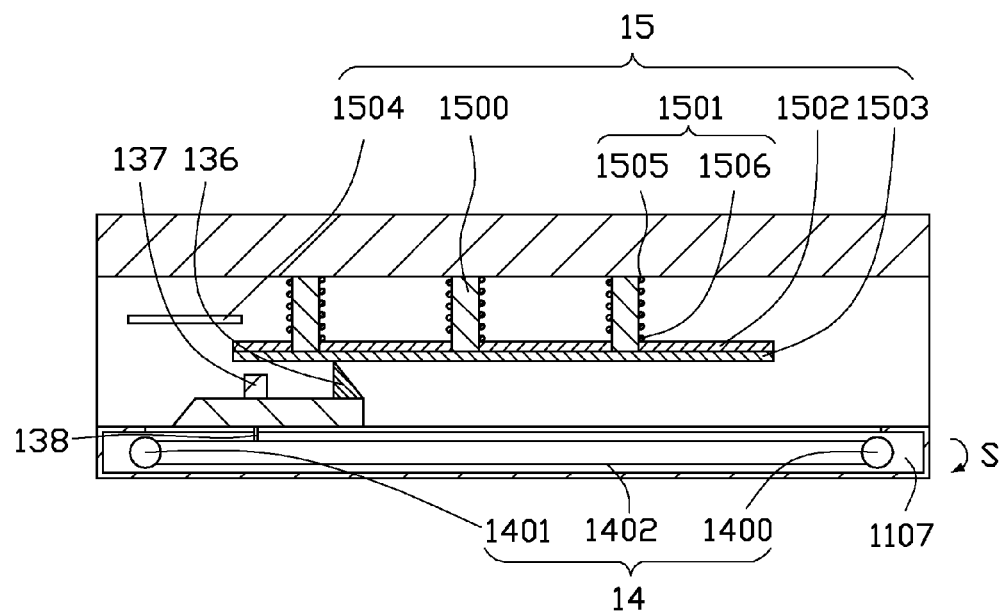
FIG. 3 is a sectional view of the clamping apparatus of FIG. 1, taken along line III-III.

In this embodiment, each block 136 is substantially prism-shaped. As shown in FIG. 3, a transverse section of the block 136 taken along line III-III is triangular. Each protrusion 137 is substantially cylindrical. The connecting pins 138 protrude from the first surface 132 of the guide plate 13. In this embodiment, the connecting pins 138 protrude from the first end 130 and the second end 131.

As shown in FIG. 3, each of the drive assemblies 14 is received in the respective second receiving spaces 1107, and includes a drive sprocket 1400, a passive sprocket 1401, and a drive member 1402. Each of the drive sprocket 1400 and the passive sprocket 1401 can be a gear, or a pulley, or other similar mechanisms. In this embodiment, the drive member 1402 is a belt, such as a timing belt with transverse grooves (not shown) arranged along the back side thereof to engage with the drive sprocket 1400 and the passive sprocket 1401. In alternative embodiments, the drive member 1402 can also be regular drive members without the transverse grooves, or the drive member 1402 can be a chain. To couple the guide member 13 to the drive assembly 14, the two connecting pins 138 are fixedly attached to upper portions of the drive member 1402. In operation, the drive member 1402 moves the guide plate 13 towards or away from the connection arm 113. In one example, a motor (not shown) can be provided to rotate the drive sprocket 1400 in a clockwise direction S as shown in FIG. 3. The drive sprocket 1400 moves the upper portion of the drive member 1402 towards the connection arm 113. The drive member 1402 accordingly moves the connecting pins 138 and the guide plate 13 toward the connection arm 113. In another example, the motor rotates the drive sprocket 1402 in the counter-clockwise direction. The counter-clockwise movement of the drive sprocket 1402 moves the connecting pins 138 and the guide plate 13 away from the connection arm 113.

The drive assemblies 14 may include a revolving bar 1403 (see FIG. 1). The revolving bar 1403 may be coupled to one of the drive sprockets 1402, and protrudes out of one of the securing arms 111 and faces away from the other securing arm 111. The revolving bar 1403 is used to be grasped and rotated by a user. In operation, the user operates the bar 1403 to rotate the drive sprocket 1402.

As shown in FIG. 2 and FIG. 3, each of the clamping assemblies 15 includes a number of guide pins 1500, a number of elastic elements 1501, a holding plate 1502, and an engaging plate 1503. The guide pins 1500 extend from the upper surface 1103. In this embodiment, the guide pins 1500 are arranged in sequence along the lengthwise direction of the securing arm 111. Each of the elastic elements 1501 can be a compression spring. The elastic elements 1501 are arranged around the respective guide pins 1500.

Each elastic element 1501 includes a first end portion 1505 and an opposite second end portion 1506 to the first end portion 1505. The first end portion 1505 is attached to the upper surface 1103 of the securing arm 111. The second end portion 1506 is attached to the holding plate 1502. The holding plate 1502 defines a number of holes 1507 (see FIG. 2) receiving the respective guide pins 1500. In this embodiment, an end of each guide pin 1500 distant from the upper surface 1103 is received in the corresponding hole 1507. The engaging plate 1503 is attached to the holding plate 1502, and faces away from the upper surface 1103. In this embodiment, a surface area of the holding plate 1502 is substantially equal to that of the engaging plate 1503, thus the holding plate 1502 is fittingly stacked on the engaging plate 1503.

Each of the clamping assemblies 15 may further include a support plate 1504. In this embodiment, the support plate 1504 extends from the side surface 1104 (see FIG. 2). A projection of the engaging plate 1503 and the holding plate 1502 on the upper surface 1103 overlaps a projection of the support plate 1504 on the upper surface 1103.

Figure 4:
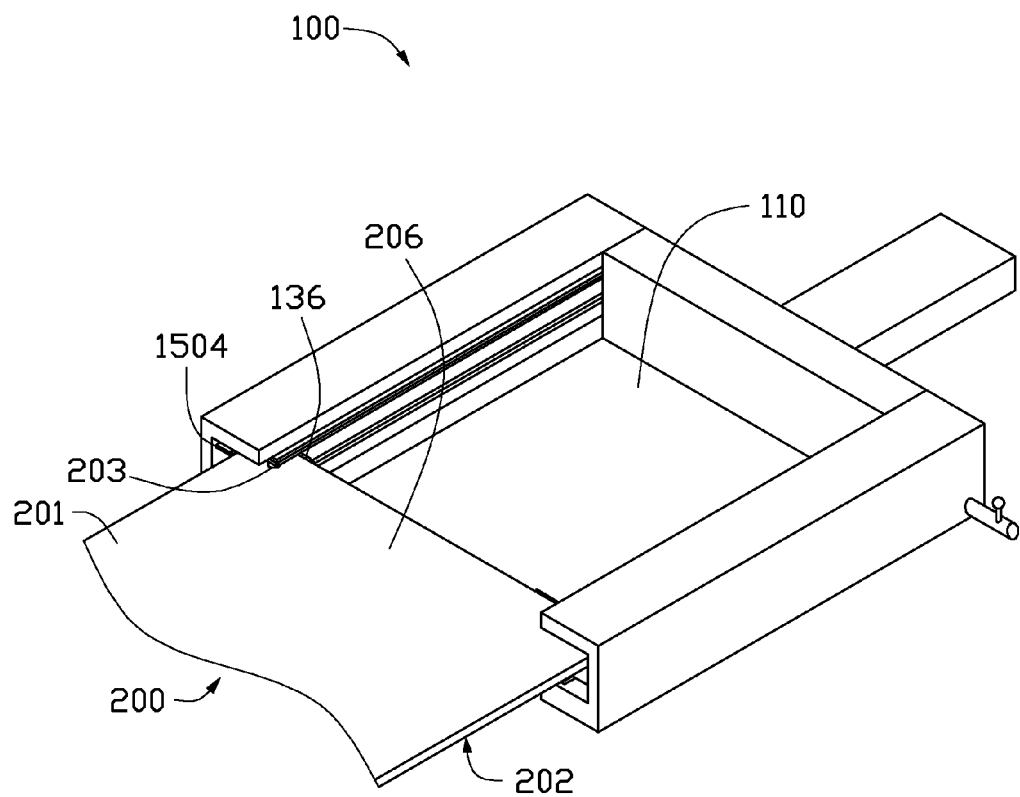
FIG. 4 is an isometric view of the clamping apparatus of FIG. 1, showing a workpiece being loaded in a first position.
Figure 5:
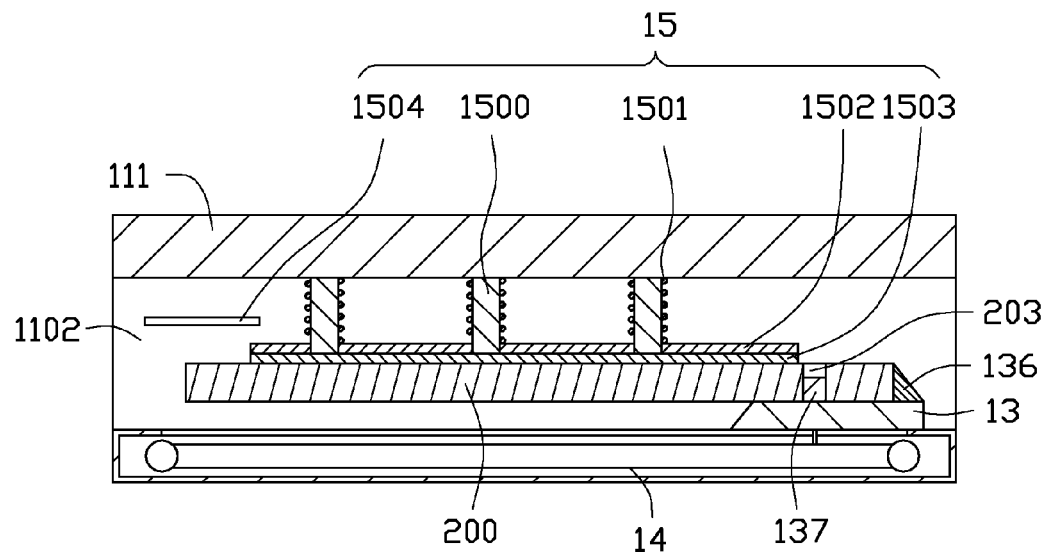
FIG. 5 is sectional view of the clamping apparatus of FIG. 4, showing the workpiece has been moved to a second position.

Referring also to FIG. 4 and FIG. 5, the guide plate 13 is selectively operated between a first position and a second position. As shown in FIG. 4, when the guide plate 13 is operated in the first position, the engaging plate 1503 is supported on the support plate 1504 and distant from the lower surface 1105. When the guide plate 13 is operated in the second position, the engaging plate 1503 is detached from the support plate 1504, and is pushed by the elastic element 1501 toward the lower surface 1105.

As shown in FIG. 4, a workpiece 200 is provided and loaded on the guide plate 13. The workpiece 200 can be a printed circuit board (PCB), for example. In this embodiment, the workpiece 200 is rectangular plate-shaped, and includes a top surface 201 and an opposite bottom surface 202 to the top surface 201. In addition, the workpiece 200 has two holes 203 defined in the top surface 201. Each of the holes 203 extends all the way through the bottom surface 202. In this embodiment, the workpiece 200 is loaded on the guide plate 13 by first aligning the holes 203 with the respective protrusions 137. Then the protrusions 137 are inserted into the respective holes 203 to position the workpiece 200 on the guide plate 13.

In this embodiment, when the workpiece 200 is arranged on the guide plate 13, the bottom surface 202 of the workpiece 200 is adjacent to the second surface 133 of the guide plate 13, and the top surface 201 is distant from the second surface 133. In addition, the protrusions 137 are entirely received in the holes 203. That is, the protrusions 137 do not protrude from the top surface 201. Furthermore, an edge portion 206 of the workpiece 200 engages with the blocks 136. In this embodiment, the blocks 136 are used to restrain movement of the workpiece 200 along the guide plate 13, and thus facilitate alignment of the protrusions 137 with the holes 203.

As shown in FIG. 5, the drive assemblies 14 then move the guide plate 13 to the second position. In this embodiment, when the guide plate 13 is located at the second position, the workpiece 200 positioned on the guide plate 13 is moved toward the connection arm 113. The workpiece 200 is entirely received in the communicating first receiving space 110 and slots 1102. In addition, the block 136 is located below and adjacent to the connection arm 113. The engaging plate 1503 can be detached from the support plate 1504, and the elastic element 1501 pushes the holding plate 1502 and the engaging plate 1503 toward the workpiece 200. In this embodiment, the two engaging plates 1503 cooperatively engage the workpiece 200 on the guide plates 13. With this configuration, the workpiece 200 is steadily clamped by the clamping apparatus 100. In manufacturing the workpiece 200, the workpiece 200 can be easily transported between different processing stations.

It is understood that the above-described embodiment is intended to illustrate rather than limit the disclosure. Variations may be made to the embodiment without departing from the spirit of the disclosure. Accordingly, it is appropriate that the appended claims be construed broadly and in a manner consistent with the scope of the disclosure.

What is claimed is:

1. A clamping apparatus comprising:
a receiving frame comprising two parallel securing arms and a connection arm connected between the securing arms, the securing arms and the connection arm cooperatively defining a first receiving space, each of the securing arms defining a slot, the two slots communicating with the first receiving space;
a guide plate arranged on the securing arms, the guide plate being configured for mounting a workpiece thereon;
two drive assemblies coupled to the respective securing arms, the drive assemblies being attached to the guide plate, the drive assemblies being configured for cooperatively moving the guide plate between a first position where the workpiece is loaded on the guide plate and distant from the connection arm, and a second position where the workpiece is adjacent to the connection arm and entirely received in the first receiving space and the slots;
two clamping assemblies coupled to the respective securing arms, the clamping assemblies being configured for cooperatively clamping the workpiece received in the first receiving space and the slots.

2. The clamping apparatus of claim 1, wherein each of the securing arms comprises an upper surface, a lower surface, and a side surface in the corresponding slot, the upper surface faces toward the lower surface, the side surface is located between and adjoins the upper surface and the lower surface, wherein the guide plate is arranged on the lower surfaces; each of the clamping assemblies comprises:
an engaging plate arranged between the upper surface and the lower surface; and
a plurality of elastic elements, each of the elastic elements being arranged between the engaging plate and the upper surface of the corresponding securing arm, the elastic elements being configured for pushing the engaging plate toward the workpiece so as to clamp the workpiece on the guide plate.

3. The clamping apparatus of claim 2, wherein each of the elastic elements is a coil spring, each of the clamping assemblies comprises a plurality of guide pins extending from the upper surface of the corresponding securing arms, each of the coil springs surrounding the corresponding guide pin.

4. The clamping apparatus of claim 3, wherein each of the clamping assemblies comprises a holding plate, the holding plate is attached to the engaging plate, the holding plate is arranged between the upper surface of the corresponding securing arm and the engaging plate, and the holding plate defines a plurality of holes receiving the respective guide pins.

5. The clamping apparatus of claim 2, wherein each of the clamping assemblies comprises a support plate, the support plate extends from the side surface of the corresponding securing arm, and the support plate is configured for supporting the engaging plate and spacing the engaging plate from the guide plate when the guide plate is moved between the first position and the second position.

6. The clamping apparatus of claim 1, wherein each of the securing arms defines a second receiving space and a groove, the groove couples the corresponding slot with the second receiving space, the groove and the second receiving space are configured for cooperatively receiving the corresponding drive assembly.

7. The clamping apparatus of claim 6, wherein each of the drive assemblies comprises:
a drive sprocket and a passive sprocket, the drive sprocket and the passive sprocket being coupled to the corresponding securing arm; and
a belt surrounding the drive sprocket and the passive sprocket and being oriented along the corresponding securing arm, the guide plate being fixedly attached to the belt.

8. The clamping apparatus of claim 7, wherein each of the drive sprocket and the passive sprocket is one of a gear and a pulley.

9. The clamping apparatus of claim 7, further comprising a revolving bar, the revolving bar being coupled to one of the drive sprockets, and the revolving bar formed on an opposite side of one of the securing arms to the first receiving space.

10. The clamping apparatus of claim 2, wherein the guide plate comprises a first surface close to the lower surfaces of the securing arms, an opposite second surface facing away from the lower surfaces, and a third surface located between and adjoining the first surface and the second surface, the third surface is angled with respect to the first surface, an angle between the third surface and the first surface is less than 60 degrees.

11. The clamping apparatus of claim 10, further comprising two protrusions protruding from the second surface of the guide plate, the protrusions being configured for positioning the workpiece on the guide plate.

12. The clamping apparatus of claim 1, further comprising an operating bar, the operating bar protruding from the connection arm in a direction away from the securing arms.

* * * * *